United States Patent
Lim et al.

(10) Patent No.: US 11,367,673 B2
(45) Date of Patent: Jun. 21, 2022

(54) SEMICONDUCTOR PACKAGE WITH HYBRID THROUGH-SILICON-VIAS

(71) Applicant: Intel Corporation, Santa Clara, CA (US)

(72) Inventors: Seok Ling Lim, Kulim Kedah (MY); Bok Eng Cheah, Gelugor Pulau Pinang (MY); Jackson Chung Peng Kong, Tanjung Tokong Pulau Pinang (MY); Jenny Shio Yin Ong, Bayan Lepas Pulau Pinang (MY)

(73) Assignee: Intel Corporation, Santa Clara, CA (US)

( * ) Notice: Subject to any disclaimer, the term of this patent is extended or adjusted under 35 U.S.C. 154(b) by 49 days.

(21) Appl. No.: 17/089,750

(22) Filed: Nov. 5, 2020

(65) Prior Publication Data

US 2022/0068764 A1 Mar. 3, 2022

(30) Foreign Application Priority Data

Sep. 2, 2020 (MY) .............................. PI2020004525

(51) Int. Cl.
*H01L 23/49* (2006.01)
*H01L 23/498* (2006.01)
(Continued)

(52) U.S. Cl.
CPC .......... *H01L 23/481* (2013.01); *H01L 21/486* (2013.01); *H01L 21/4853* (2013.01); *H01L 21/76898* (2013.01); *H01L 23/49827* (2013.01); *H01L 24/13* (2013.01); *H01L 24/14* (2013.01); *H01L 24/16* (2013.01); *H01L 24/17* (2013.01); *H01L 24/81* (2013.01); *H01L 25/16* (2013.01); *H01L 23/49833* (2013.01); *H01L 2224/13025* (2013.01); *H01L 2224/1403* (2013.01); *H01L 2224/16145* (2013.01); *H01L 2224/16225* (2013.01); *H01L 2224/1703* (2013.01);
(Continued)

(58) Field of Classification Search
None
See application file for complete search history.

(56) References Cited

U.S. PATENT DOCUMENTS

2007/0289127 A1* 12/2007 Hurwitz ............... H05K 3/4697
257/E23.005
2011/0254160 A1* 10/2011 Tsai ........................ H01L 23/13
257/738
(Continued)

FOREIGN PATENT DOCUMENTS

DE 102018112868 A1 * 1/2019 ........... H01L 21/486

*Primary Examiner* — Julio J Maldonado
*Assistant Examiner* — Lawrence C Tynes, Jr.
(74) *Attorney, Agent, or Firm* — Viering, Jentschura & Partner mbB

(57) ABSTRACT

According to various examples, a device is described. The device may include an interposer. The device may also include a plurality of first through-silicon-vias disposed in the interposer, wherein the plurality of first through-silicon-vias have a first diameter. The device may also include a plurality of second through-silicon-vias disposed in the interposer, wherein the plurality of second through-silicon-vias have a second diameter larger than the first via diameter. The device may also include a first recess in the interposer positioned at bottom ends of the plurality of second through-silicon-vias.

20 Claims, 7 Drawing Sheets

(51) Int. Cl.
*H01L 21/48* (2006.01)
*H01L 21/768* (2006.01)
*H01L 23/48* (2006.01)
*H01L 25/16* (2006.01)
*H01L 23/00* (2006.01)

(52) U.S. Cl.
CPC ............... *H01L 2224/17181* (2013.01); *H01L 2224/81815* (2013.01)

(56) References Cited

U.S. PATENT DOCUMENTS

| | | | |
|---|---|---|---|
| 2011/0304999 A1* | 12/2011 | Yu | H01L 23/5385 29/829 |
| 2013/0026609 A1* | 1/2013 | Wu | H01L 23/49827 257/632 |
| 2017/0271266 A1* | 9/2017 | Kim | H01L 24/97 |
| 2019/0229057 A1* | 7/2019 | Cheah | H01L 23/48 |
| 2019/0333861 A1* | 10/2019 | Pietambaram | H01L 25/03 |
| 2020/0395300 A1* | 12/2020 | Xie | H01L 25/0655 |
| 2021/0407923 A1* | 12/2021 | Kim | H01L 23/13 |

\* cited by examiner

SEMICONDUCTOR PACKAGE WITH HYBRID THROUGH-SILICON-VIAS

CROSS-REFERENCE TO RELATED APPLICATIONS

This application claims priority to Malaysian Patent Application No. PI2020004525, filed on Sep. 2, 2020, which is incorporated herein in its entirety.

BACKGROUND

Conventional semiconductor packages have through-silicon-vias (TSVs) in an interposer of the semiconductor package to deliver power and signals. Due to device miniaturization, TSV geometries have been scaled down in order to reduce real estate space. However, this may result in max current (Imax) constraints driven by reduced current carrying capability of the smaller TSVs. This may lead to device reliability risks and decreased computing performance.

Further, conventional semiconductor packages have passive devices disposed far apart from the stacked integrated circuit devices on package substrate landside. This may result in escalated power supply noise jitter and Vmin/IR drop performance degradations due to extensive power loop inductance between stacked integrated circuit chiplets and the passive devices.

Existing solutions to solve the above-mentioned problems include increasing metal-insulator-metal (MIM) capacitance of chiplets or base die to suppress power delivery network peak impedance (ZPDN), increasing device voltage supply (e.g. from 0.9V to 1.1V) to allow performance scaling, and increasing TSV counts to meet required current density (Imax) and reliability risks. However, these existing solutions may lead to increased device power consumptions and/or increased silicon device form factor.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1A:
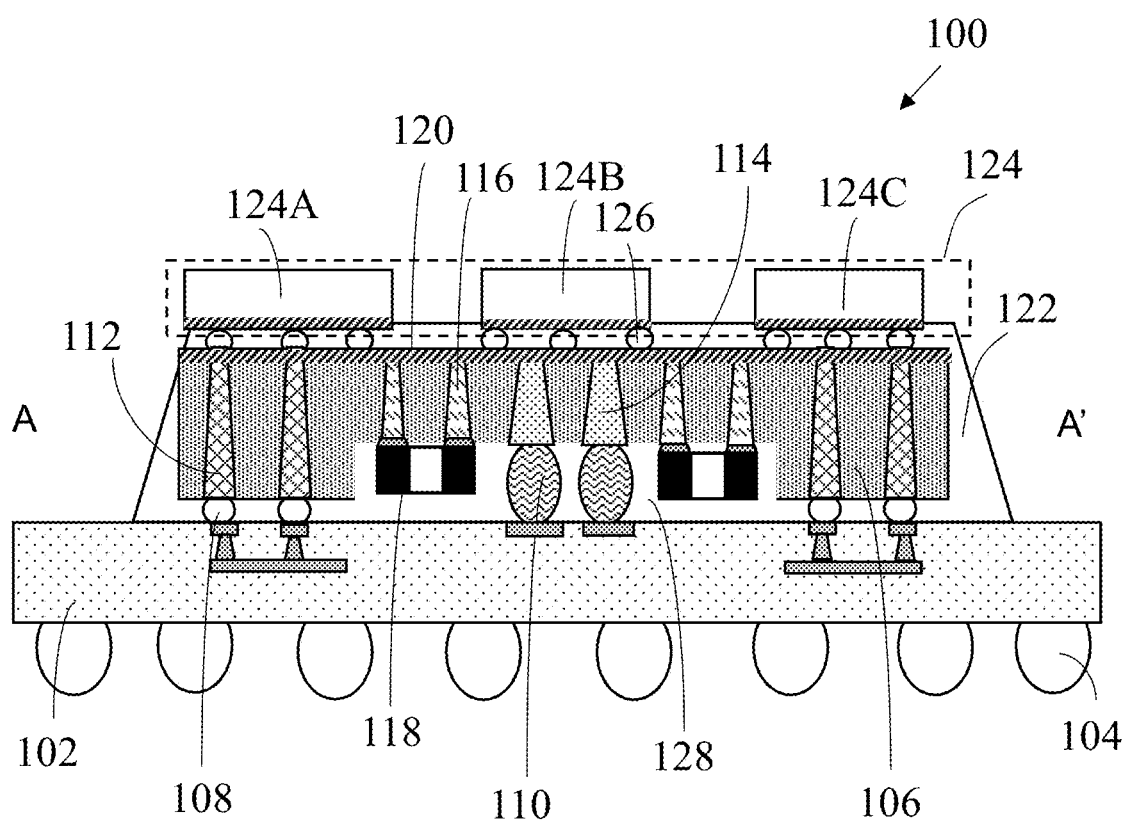
FIG. 1A shows a cross-sectional view of a semiconductor package according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for the present devices, and various aspects are provided for the methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

An advantage of the present disclosure may include Fmax performance gain by mitigating of direct current (DC) and alternating current (AC) losses by reducing Vmin and LL3 impedance.

An advantage of the present disclosure may include minimizing device power consumption by improving power integrity through power delivery network (PDN) parasitic impedance reduction with embedded decoupling capacitors. This may lower the power supply voltage threshold.

An advantage of the present disclosure may include device reliability and computing performance improvements by increasing Imax capacity through the configurable geometries of TSV interconnects and hybrid side bumps with increased geometries to circumvent geometry constraints in a conventional silicon interposer.

These and other aforementioned advantages and features of the aspects herein disclosed will be apparent through reference to the following description and the accompanying drawings. Furthermore, it is to be understood that the features of the various aspects described herein are not mutually exclusive and can exist in various combinations and permutations.

The present disclosure generally relates to a device. The device may include an interposer. The device may also include a plurality of first through-silicon-vias disposed in the interposer, wherein the plurality of first through-silicon-vias have a first diameter. The device may also include a plurality of second through-silicon-vias disposed in the interposer, wherein the plurality of second through-silicon-vias have a second diameter larger than the first via diameter. The device may also include a first recess in the interposer positioned at bottom ends of the plurality of second through-silicon-vias.

The present disclosure generally relates to a method of forming a device. The method may include forming an interposer. The method may include forming a first recess in the interposer. The method may also include forming a plurality of first through-silicon-vias in the interposer, wherein the plurality of first through-silicon-vias have a first diameter. The method may also include forming a plurality of second through-silicon-vias in the interposer, wherein the plurality of second through-silicon-vias have a second diameter larger than the first via diameter, and wherein the first recess is positioned at bottom ends of the plurality of second through-silicon-vias.

The present disclosure generally relates to a computing device. The computing device may include a printed circuit board. The computing device may include a semiconductor package coupled to the printed circuit board including an interposer. The semiconductor package may include a plurality of first through-silicon-vias disposed in the interposer, wherein the plurality of first through-silicon-vias have a first diameter. The semiconductor package may also include a plurality of second through-silicon-vias disposed in the interposer, wherein the plurality of second through-silicon-vias have a second diameter larger than the first via diameter. The semiconductor package may also include a first recess in the interposer positioned at bottom ends of the plurality of second through-silicon-vias.

To more readily understand and put into practical effect, the present device, computing device, method, and other particular aspects will now be described by way of examples and not limitations, and with reference to the figures. For the sake of brevity, duplicate descriptions of features and properties may be omitted.

Figure 1B:
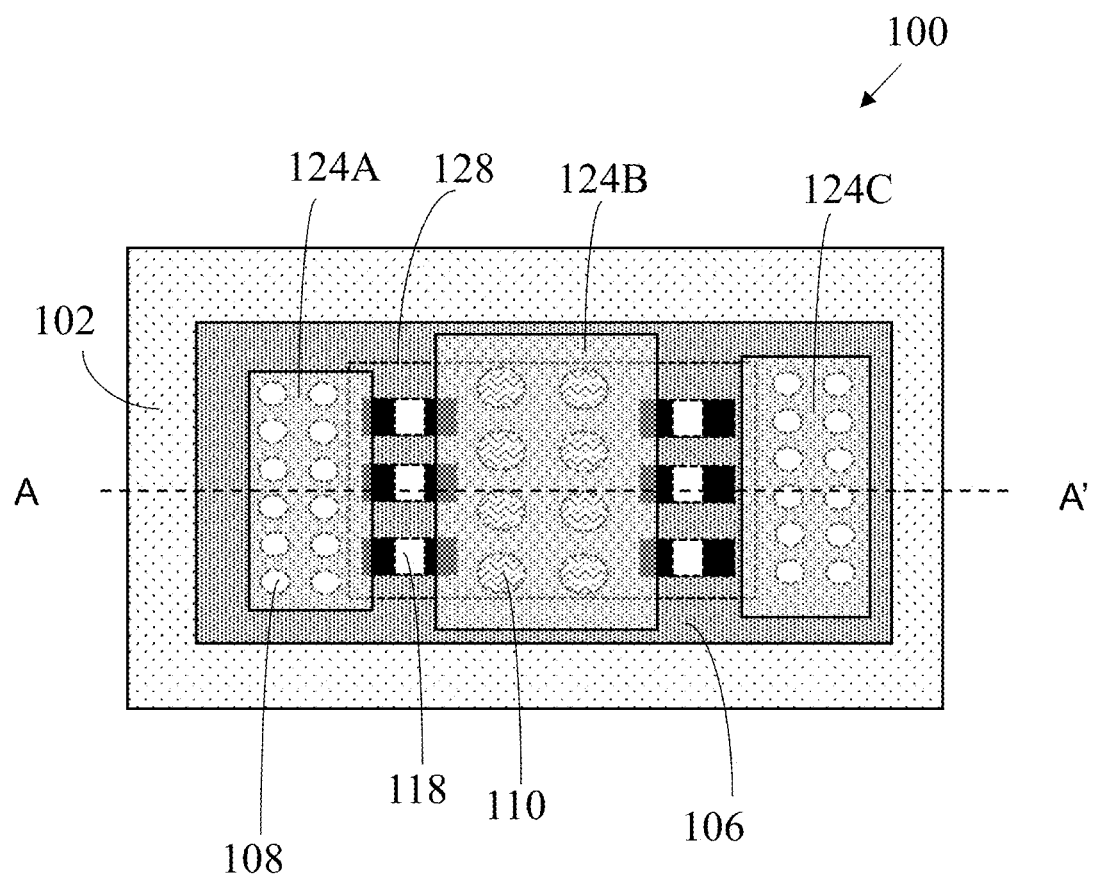
FIG. 1B shows a top view of the semiconductor package according to an aspect of the semiconductor package shown in FIG. 1A.

FIG. 1A shows a cross-sectional view of a semiconductor package according to an aspect of the present disclosure. FIG. 1B shows a top view of the semiconductor package according to an aspect of the semiconductor package shown in FIG. 1A.

In an aspect of the present disclosure, a semiconductor package 100 is shown in FIGS. 1A and 1B. The semiconductor package 100 may be a device. The semiconductor package 100 may be a stacked semiconductor package like a 2.5D or a 3D semiconductor package.

In an aspect of the present disclosure, the semiconductor package 100 may include a package substrate 102. The package substrate 102 may include contact pads, electrical interconnects, routings, and other features, which are not shown in any of the present figures. The package substrate 102 may have one or more rigid core layers for improved structural stability or a coreless substrate package for a reduced form-factor. In other aspects, the package substrate 102 may be part of a larger substrate that supports additional semiconductor packages, and/or components.

In an aspect of the present disclosure, the semiconductor package 100 may include a plurality of solder balls 104. The package substrate 102 may be connected to a motherboard (not shown) through the plurality of solder balls 104. The motherboard may be a PCB. In an aspect, the plurality of solder balls 104 may provide an electrical connection between the package substrate 102, and the motherboard.

In an aspect of the present disclosure, the semiconductor package 100 may include an interposer 106. The interposer 106 may be an electrical routing interface between one connection and another. The purpose of the interposer 106 may be to redistribute a connection to a wider pitch or to reroute a connection to a different connection. The interposer 106 may be an active interposer (i.e., comprising one or more transceiver devices) or a passive interposer (i.e., without transceiver devices). The interposer 108 may be a silicon interposer, a ceramic interposer, or organic interposer.

In an aspect of the present disclosure, the semiconductor package 100 may include a plurality of first package bumps 108 disposed on the package substrate 102. In an aspect, each first package bump 108 of the plurality of first package bumps 108 may have a first bump diameter. The first bump diameter may be between 30 μm and 80 μm.

In an aspect of the present disclosure, the semiconductor package 100 may include a plurality of second package bumps 110 disposed on the package substrate 102. In an aspect, each second package bump 110 of the plurality of second package bumps 110 may have a second bump diameter. The second bump diameter may be between 90 μm and 200 μm. In an aspect, the second bump diameter may be larger than the first bump diameter. In an aspect, the plurality of first package bumps 108 and/or the plurality of second package bumps 110 may be controlled collapse chip connection (C4) bumps.

In an aspect of the present disclosure, an underfill layer 122 may be deposited to cover, and to protect the plurality of first package bumps 108, and the plurality of second package bumps 110 in a conventional manner. The underfill layer 122 may be provided to enhance the mechanical reliability of the plurality of first package bumps 108 and the plurality of second package bumps 110. The underfill layer 122 may be provided using either a conventional underfilling process or no-flow underfilling process to reduce the effects of thermal expansion and reduce the stress and strain on the plurality of first package bumps 108, and the plurality of second package bumps 110.

In an aspect of the present disclosure, the interposer 106 may be disposed on the package substrate 102. In an aspect, the interposer 106 may be connected to the package substrate 102 through the plurality of first package bumps 108 and/or the plurality of second package bumps 110. The plurality of first package bumps 108 and/or the plurality of second package bumps 110 may also provide an electrical connection between the interposer 106, and the package substrate 102.

In an aspect of the present disclosure, the interposer may include a hybrid of TSVs of different diameters and/or heights. In an aspect of the present disclosure, the interposer 106 may include a plurality of first TSVs 112. In an aspect, the plurality of first package bumps 108 may be disposed below the plurality of first TSVs 112. In an aspect, the plurality of first package bumps 108 may provide an electrical connection between the plurality of first TSVs 112, and the package substrate 102. In an aspect, each first TSV 112 of the plurality of first TSVs 112 may have a first via diameter. The first via diameter may be between 30 μm to 60 μm. In an aspect, each first TSV 112 of the plurality of first TSVs 112 may have a first via height. The first via height may be between 100 μm to 700 μm.

In an aspect of the present disclosure, the interposer 106 may include a plurality of second TSVs 114. In an aspect, the plurality of second package bumps 110 may be disposed below the plurality of second TSVs 114. In an aspect, the plurality of second package bumps 110 may provide an electrical connection between the plurality of second TSVs 114, and the package substrate 102. In an aspect, each second TSV 114 of the plurality of second TSVs 114 may have a second via diameter. The second via diameter may be between 90 nm to 200 nm. In an aspect, the second via diameter may be larger than the first via diameter. In an aspect, each second TSV 114 of the plurality of second TSVs 114 may have a second via height. The second via height may be between 40 nm to 500 nm. In an aspect, the second via height may be shorter than the first via height. In an aspect, the plurality of second TSVs 114 is adjacent to the plurality of first TSVs 112.

In an aspect of the present disclosure, the interposer 106 may include a plurality of third TSVs 116. In an aspect, each third TSV 116 of the plurality of third TSVs 116 may have a third via diameter. In an aspect, the third via diameter may be smaller than the second via diameter. In an aspect, the third via diameter may be substantially similar to the first via diameter. In another aspect, the third via diameter may be substantially similar to the second via diameter. In an aspect, each third TSV 116 of the plurality of third TSVs 116 may have a third via height. The third via height may be between 40 nm to 500 nm. In an aspect, the third via height may be shorter than the first via height. In an aspect, the third via height may be substantially similar to the second via height. In an aspect, the plurality of third TSVs 116 may not be coupled to or electrically connected to the package substrate 102. In an aspect, the plurality of third TSVs 116 is adjacent to the plurality of first TSVs 112 and/or the plurality of second TSVs 114.

In an aspect of the present disclosure, the semiconductor package 100 may include a recess 128. In an aspect, the recess 128 may be in the interposer 106. In an aspect, the recess 128 may be below the plurality of second TSVs 114. In an aspect, the recess 128 may be below the plurality of third TSVs 116. In an aspect, the recess 128 may be below both the plurality of second TSVs 114 and the plurality of third TSVs 116. In an aspect, the recess 128 may have a depth ranging from 20% to 60% of a thickness of the interposer 106.

In an aspect of the present disclosure, the plurality of second package bumps 110 may be disposed in the recess 128. In an aspect, the depth of the recess 128 may be chosen based on a difference between the size of a second package bump 110 and the size of a first package bump 108. In an aspect, a total length of the first TSV and the first solder bump is substantially similar to a total length of the second TSV and the second solder bump.

In an aspect of the present disclosure, the semiconductor package 100 may include a passive device 118. Passive components are electrical components that allow signal and/or power delivery noise filtering for improved electrical performance. In an aspect, the passive device 118 may be an inductor, a resistor, a diode or a decoupling capacitor e.g., a multilayer ceramic capacitor or a silicon capacitor.

In an aspect of the present disclosure, the passive device 118 may be disposed in the recess 128. In an aspect, the passive device 118 may be coupled to the plurality of third TSVs 116. In an aspect, the passive device 118 may not be touching the package substrate 102. In an aspect, there may be a gap between the passive device 118 and the package substrate 102. In an aspect, the depth of the recess 128 may be chosen to accommodate the passive device 118, without the passive device 118 touching the package substrate 102.

Alternatively, in an aspect of the present disclosure, instead of the passive device 118, an active device may be disposed in the recess 128. An active device may be capable of transmitting and/or processing an electrical signal. The active device may include one or more transistor devices. In an aspect, the active device may be coupled to the plurality of third TSVs 116. In an aspect, the active device may not be touching the package substrate 102. In an aspect, there may be a gap between the active device and the package substrate 102. In an aspect, the depth of the recess 128 may be chosen to accommodate the active device, without the active device touching the package substrate 102.

In an aspect of the present disclosure, the semiconductor package 100 may include at least one semiconductor device 124. In an aspect, the at least one semiconductor device 124 may be made from any suitable semiconductor, such as silicon or gallium arsenide. The at least one semiconductor device 124 may be a semiconductor die, a chip or a set of chiplets, e.g., a system-on-chip (SOC), a platform controller hub (PCH)/chipset, a memory device, a field programmable gate array (FPGA) device, a central processing unit (CPU), or a graphic processing unit (GPU). In the aspect shown in FIG. 1A, the at least one semiconductor device 124 may be a set of chiplets, which may include a first semiconductor device 124A, a second semiconductor device 124B, and a third semiconductor device 124C.

In an aspect of the present disclosure, the at least one semiconductor device 124 may be disposed on the interposer 106. In an aspect of the present disclosure, a plurality of solder bumps 126 may be disposed on the interposer 106. The plurality of solder bumps 126 may be disposed on an interposer chiplet surface of the interposer 106. The plurality of solder bumps 126 may provide an electrical connection between the plurality of first TSVs 112, the plurality of second TSVs 114, the plurality of third TSVs 116, and the at least one semiconductor device 124. In an aspect, the plurality of first TSVs 112 may be configured to transmit signals between the package substrate 102, and the semiconductor device 124. In an aspect, the plurality of second TSVs 114 may be configured to transmit power between the package substrate 102 and the semiconductor device 124. Since the plurality of second TSVs 114 and the plurality of second package bumps 110 have a larger diameter than the plurality of first TSVs 112 and the plurality of first package bumps 108, there may be lower resistance in the plurality of second TSVs 114 and the plurality of second package bumps 110 compared to the plurality of first TSVs 112 and the plurality of first package bumps 108. Therefore, in a preferred aspect, power voltages such as the power supply reference voltage (Vcc), and the ground reference voltage (Vss) may be facilitated by the plurality of second TSVs 114 instead of the plurality of first TSVs 112.

In an aspect of the present disclosure, the semiconductor device 124 may be electrically coupled to the package substrate 102 through the plurality of first TSVs 112 and the plurality of second TSVs 114. In an aspect, the semiconductor device 124 may be electrically coupled to the passive device 118 through the plurality of third TSVs 116. In an aspect, the third plurality of TSVs 116 may facilitate a short power loop inductance between the semiconductor device 124 and the passive device 118 without traversing through the package substrate 102.

In an aspect of the present disclosure, the semiconductor device 124, which may include the first semiconductor device 124A, the second semiconductor device 124B, and the third semiconductor device 124C may pass signals and/or power to each other through an RDL 120 within the interposer 106. In an aspect, the RDL 120 may include a plurality of conductive traces interleaving with a plurality of dielectric layers. In further aspects, the RDL 120 is coupled to the plurality of first TSVs 112, the plurality of second TSVs 114, and the plurality of third TSVs 116 within the interposer 106. In an aspect, the semiconductor device 124 may pass signal I/O and/or power from the package substrate 102 between the first semiconductor device 124A, the second semiconductor device 124B, and the third semiconductor device 124C through the RDL 120.

Figure 2:
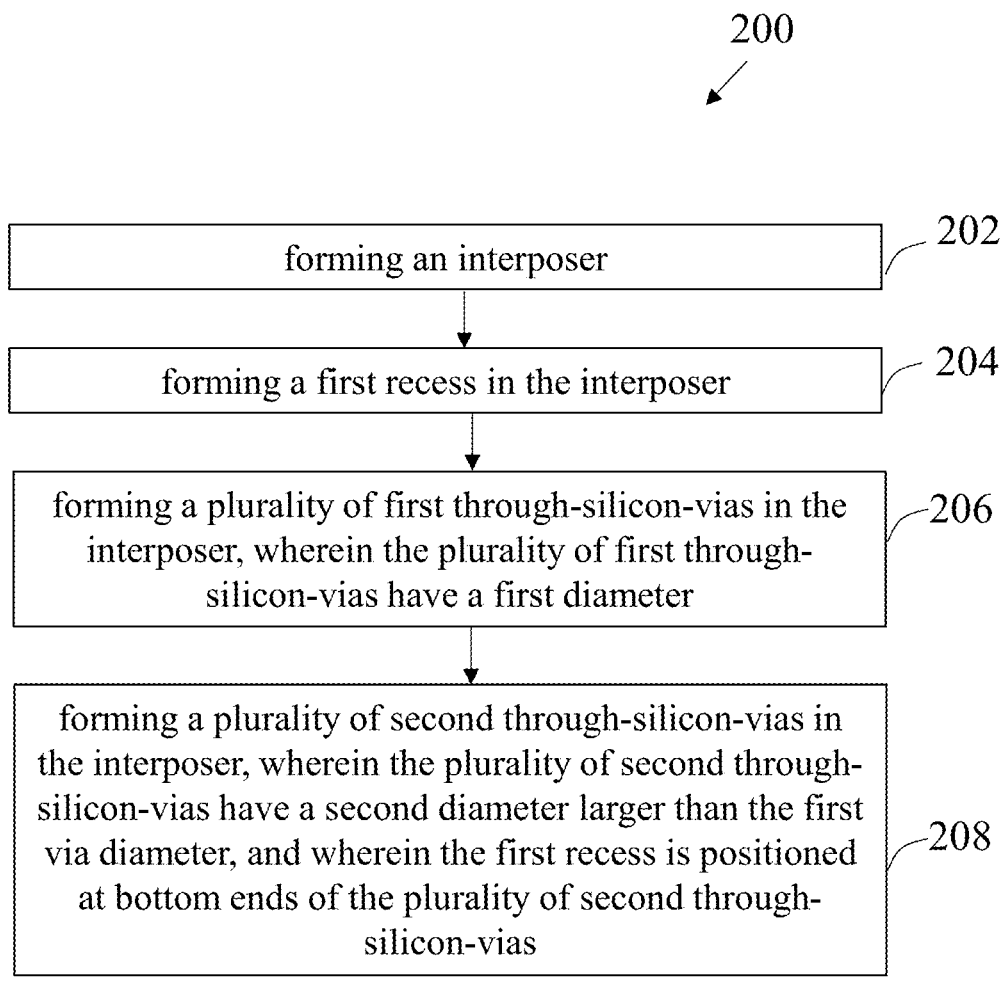
FIG. 2 shows a flow chart illustrating a method of forming a semiconductor package according to an aspect of the present disclosure.

FIG. 2 shows a flow chart illustrating a method of forming a semiconductor package according to an aspect of the present disclosure.

As shown in FIG. 2, there may be a method 200 of forming a device. In the method 200, a first operation 202 may include forming an interposer. A second operation 204 may include forming a first recess in the interposer. A third operation 206 may include forming a plurality of first through-silicon-vias in the interposer, wherein the plurality of first through-silicon-vias have a first diameter. A fourth operation 208 may include forming a plurality of second through-silicon-vias in the interposer, wherein the plurality of second through-silicon-vias have a second diameter larger than the first via diameter, and wherein the first recess is positioned at bottom ends of the plurality of second through-silicon-vias.

It will be understood that the above operations described above relating to FIG. 2 are not limited to this particular order. Any suitable, modified order of operations may be used.

Figure 3:
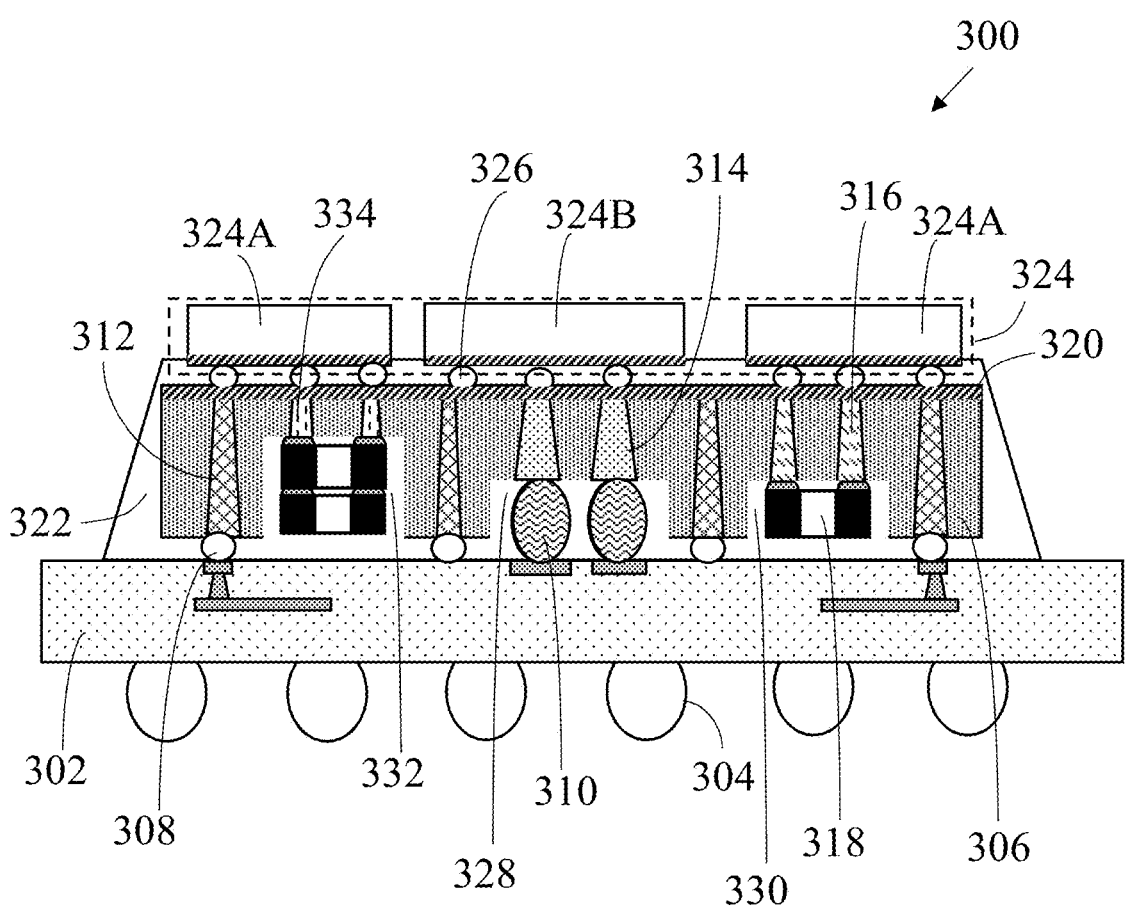
FIG. 3 shows a cross-sectional view of a semiconductor package according to an aspect of the present disclosure.

FIG. 3 shows a cross-sectional view of a semiconductor package according to an aspect of the present disclosure.

In an aspect of the present disclosure, a semiconductor package 300 is shown in FIG. 3. The semiconductor package 300 may be a device. The semiconductor package 300 may include a semiconductor package, e.g., a stacked semiconductor package like a 2.5D or a 3D semiconductor package.

In an aspect of the present disclosure, the semiconductor package 300 may include a package substrate 302. The package substrate 302 may include contact pads, electrical interconnects, routings, and other features, which are not shown in any of the present figures. The package substrate 302 may have one or more rigid core layers for improved structural stability or a coreless substrate package for a reduced form-factor. In other aspects, the package substrate 302 may be part of a larger substrate that supports additional semiconductor packages, and/or components.

In an aspect of the present disclosure, the semiconductor package 300 may include a plurality of solder balls 304. The package substrate 302 may be connected to a motherboard (not shown) through the plurality of solder balls 304. The motherboard may be a PCB. In an aspect, the plurality of solder balls 304 may provide an electrical connection between the package substrate 302, and the motherboard.

In an aspect of the present disclosure, the semiconductor package 300 may include an interposer 306. The interposer 306 may be an electrical routing interface between one connection and another. The purpose of the interposer 306 may be to redistribute a connection to a wider pitch or to reroute a connection to a different connection. The interposer 306 may be an active interposer (i.e., comprising one or more transceiver devices) or a passive interposer (i.e., without transceiver devices). The interposer 308 may be a silicon interposer, a ceramic interposer, or organic interposer.

In an aspect of the present disclosure, the semiconductor package 300 may include a plurality of first package bumps 308 disposed on the package substrate 302. In an aspect, each first package bump 308 of the plurality of first package bumps 308 may have a first bump diameter. The first bump diameter may be between 30 µm to 80 µm.

In an aspect of the present disclosure, the semiconductor package 300 may include a plurality of second package bumps 310 disposed on the package substrate 302. In an aspect, each second package bump 310 of the plurality of second package bumps 310 may have a second bump diameter. The second bump diameter may be between 90 µm to 200 µm. In an aspect, the second bump diameter may be larger than the first bump diameter. In an aspect, the plurality of first package bumps 308 and/or the plurality of second package bumps 310 may be controlled collapse chip connection (C4) bumps.

In an aspect of the present disclosure, an underfill layer 322 may be deposited to cover, and to protect the plurality of first package bumps 308, and the plurality of second package bumps 310 in a conventional manner. The underfill layer 322 may enhance the mechanical reliability of the plurality of first package bumps 108 and the plurality of second package bumps 110. The underfill layer 322 may be provided using either a conventional underfilling process or no-flow underfilling process to reduce the effects of thermal expansion and reduce the stress and strain on the plurality of first package bumps 308, and the plurality of second package bumps 310.

In an aspect of the present disclosure, the interposer 306 may be disposed on the package substrate 302. In an aspect, the interposer 306 may be connected to the package substrate 302 through the plurality of first package bumps 308 and/or the plurality of second package bumps 310. The plurality of first package bumps 308 and/or the plurality of second package bumps 310 may also provide an electrical connection between the interposer 306, and the package substrate 302.

In an aspect of the present disclosure, the interposer may include a hybrid of TSVs of different diameters and/or heights. In an aspect of the present disclosure, the interposer 306 may include a plurality of first TSVs 312. In an aspect, the plurality of first package bumps 308 may be disposed below the plurality of first TSVs 312. In an aspect, the plurality of first package bumps 308 may provide an electrical connection between the plurality of first TSVs 312, and the package substrate 302. In an aspect, each first TSV 312 of the plurality of first TSVs 312 may have a first via diameter. The first via diameter may be between 30 µm to 60 µm. In an aspect, each first TSV 312 of the plurality of first TSVs 312 may have a first via height. The first via height may be between 100 µm to 700 µm.

In an aspect of the present disclosure, the interposer 306 may include a plurality of second TSVs 314. In an aspect, the plurality of second package bumps 310 may be disposed below the plurality of second TSVs 314. In an aspect, the plurality of second package bumps 310 may provide an electrical connection between the plurality of second TSVs 314, and the package substrate 302. In an aspect, each second TSV 314 of the plurality of second TSVs 314 may have a second via diameter. The second via diameter may be between 90 nm to 200 nm. In an aspect, the second via diameter may be larger than the first via diameter. In an aspect, each second TSV 314 of the plurality of second TSVs 314 may have a second via height. The second via height may be between 40 nm to 500 nm. In an aspect, the second via height may be shorter than the first via height. In an aspect, the plurality of second TSVs 314 are adjacent to the plurality of first TSVs 312.

In an aspect of the present disclosure, the interposer 306 may include a plurality of third TSVs 316. In an aspect, each third TSV 316 of the plurality of third TSVs 316 may have a third via diameter. In an aspect, the third via diameter may be smaller than the second via diameter. In an aspect, the third via diameter may be substantially similar to the first via diameter. In another aspect, the third via diameter may be substantially similar to the second via diameter. In an aspect, each third TSV 316 of the plurality of third TSVs 316 may have a third via height. The third via height may be between 40 nm to 500 nm. In an aspect, the third via height may be shorter than the first via height. In an aspect, the third via height may be substantially similar to the second via height. In an aspect, the plurality of third TSVs 316 may not be coupled to or electrically connected to the package substrate 302. In an aspect, the plurality of third TSVs 316 is adjacent to the plurality of first TSVs 312 and/or the plurality of second TSVs 314.

In an aspect of the present disclosure, the interposer 306 may include a plurality of fourth TSVs 334. In an aspect, each fourth TSV 334 of the plurality of fourth TSVs 334 may have a fourth via diameter. In an aspect, the fourth via diameter may be smaller than the second via diameter. In an aspect, the fourth via diameter may be substantially similar to the first via diameter. In another aspect, the fourth via diameter may be substantially similar to the second via diameter. In an aspect, each fourth TSV 334 of the plurality of fourth TSVs 334 may have a fourth via height. The fourth via height may be between 20 nm to 250 µm. In an aspect, the fourth via height may be shorter than the first via height, and/or the second via height, and/or the third via height. In an aspect, the plurality of fourth TSVs 334 may not be coupled to or electrically connected to the package substrate 302. In an aspect, the plurality of fourth TSVs 334 is adjacent to the plurality of first TSVs 312, and/or the plurality of second TSVs 314, and/or the plurality of third TSVs 316.

In an aspect of the present disclosure, the semiconductor package 300 may include a first recess 328. In an aspect, the first recess 328 may be in the interposer 306. In an aspect, the first recess 328 may be below the plurality of second TSVs 314. In an aspect, the first recess 328 may have a depth ranging from 20% to 60% of a thickness of the interposer 306. In an aspect, the first recess 328 may be positioned at bottom ends of the plurality of second TSVs 314.

In an aspect of the present disclosure, the plurality of second package bumps 310 may be disposed in the first recess 328. In an aspect, the depth of the first recess 328 may be chosen based on a difference between the size of a second package bump 310 and the size of a first package bump 308. In an aspect, a total length of the first TSV 312 and the first solder bump 308 is substantially similar to a total length of the second TSV 314 and the second solder bump 310.

In an aspect of the present disclosure, the semiconductor package 300 may include a second recess 330. In an aspect, the second recess 330 may be in the interposer 306. In an aspect, the second recess 330 may be below the plurality of third TSVs 316. In an aspect, the second recess 330 may be positioned at bottom ends of the plurality of third TSVs 316. In an aspect, the second recess 330 may be adjacent to the first recess 328. In an aspect, the second recess 330 may have a second recess depth ranging from 20% to 60% of a thickness of the interposer 306. In an aspect, the second recess depth may be substantially similar to a first recess depth of the first recess 328.

In an aspect of the present disclosure, the semiconductor package 300 may include a third recess 332. In an aspect, the third recess 332 may be in the interposer 306. In an aspect, the third recess 332 may be below the plurality of fourth TSVs 334. In an aspect, the third recess 332 may be positioned at bottom ends of the plurality of fourth TSVs 334. In an aspect, the third recess 332 may be adjacent to the first recess 328 and/or the second recess 330. In an aspect, the third recess 332 may have a third recess depth ranging from 40% to 80% of a thickness of the interposer 306. In an aspect, the third recess depth may be greater than the first recess depth and/or the second recess depth.

In an aspect of the present disclosure, the semiconductor package 300 may include a passive device 318. Passive components are electrical components that allow signal and/or power delivery noise filtering for improved electrical performance. In an aspect, the passive device 318 may be an inductor, a resistor, a diode or a decoupling capacitor e.g., a multilayer ceramic capacitor or a silicon capacitor.

In an aspect of the present disclosure, the passive device 318 may be disposed in the second recess 330. In an aspect, the passive device 318 may be coupled to the plurality of third TSVs 316. In an aspect, the passive device 318 may not be touching the package substrate 302. In an aspect, there may be a gap between the passive device 318 and the package substrate 302. In an aspect, the depth of the second recess 330 may be chosen to accommodate the passive device 318, without the passive device 318 touching the package substrate 302.

In an aspect of the present disclosure, a plurality of passive devices 318, e.g., 2 passive devices 318 may be disposed in the third recess 332. In an aspect, the plurality of passive devices 318 may be coupled to the plurality of fourth TSVs 334. In an aspect, the plurality of passive devices 318 may be have a stacked configuration. In an aspect, the plurality of passive devices 318 may not be touching the package substrate 302. In an aspect, there may be a gap between the plurality of passive devices 318 and the package substrate 302. In an aspect, the depth of the third recess 332 may be chosen to accommodate the plurality of passive devices 318, without the plurality of passive devices 318 touching the package substrate 302.

In an aspect, the first recess 328, the second recess 330, the third recess 332, and the passive device 318 may be within a projected footprint of at least the semiconductor device 324 on the interposer 306.

In an aspect of the present disclosure, instead of the passive device 318, one or more active devices may be disposed in the second recess 330 and/or the third recess 332. An active device may be capable of transmitting and/or processing an electrical signal. The one or more active devices may include one or more transistor devices. In an aspect, the one or more active devices may be coupled to the plurality of third TSVs 316 and/or the plurality of fourth TSVs 334. In an aspect, the one or more active devices may not be touching the package substrate 302. In an aspect, there may be a gap between the one or more active devices and the package substrate 302. In an aspect, the depth of the second recess 330 and/or the third recess 332 may be chosen to accommodate the one or more active devices, without the one or more active devices touching the package substrate 302.

In an aspect of the present disclosure, the semiconductor package 300 may include at least one semiconductor device 324. In an aspect, the at least one semiconductor device 324 may be made from any suitable semiconductor, such as silicon or gallium arsenide. The at least one semiconductor device 324 may be a semiconductor die, a chip or a set of chiplets, e.g., a system-on-chip (SOC), a platform controller hub (PCH)/chipset, a memory device, a field programmable gate array (FPGA) device, a central processing unit (CPU), or a graphic processing unit (GPU). In the aspect shown in FIG. 3, the at least one semiconductor device 324 may be a set of chiplets, which may include a first semiconductor device 324A, a second semiconductor device 324B, and a third semiconductor device 324C.

In an aspect of the present disclosure, the at least one semiconductor device 324 may be disposed on the interposer 306. In an aspect of the present disclosure, a plurality of solder bumps 326 may be disposed on the interposer 306. The plurality of solder bumps 326 may be disposed on an interposer chiplet surface of the interposer 306. The plurality of solder bumps 326 may provide an electrical connection between the plurality of first TSVs 312, the plurality of second TSVs 314, the plurality of third TSVs 316, the plurality of fourth TSVs 334, and the at least one semiconductor device 324. In an aspect, the plurality of first TSVs 312 may be configured to transmit signals between the package substrate 302, and the semiconductor device 324. In an aspect, the plurality of second TSVs 314 may be configured to transmit power between the package substrate 302, and the semiconductor device 324. Since the plurality of second TSVs 314, and the plurality of second package bumps 310 have a larger diameter than the plurality of first TSVs 312, and the plurality of first package bumps 308, there may be lower resistance in the plurality of second TSVs 314, and the plurality of second package bumps 310 compared to the plurality of first TSVs 312, and the plurality of first package bumps 308. Therefore, in a preferred aspect, power voltages such as the power supply reference voltage (Vcc), and the ground reference voltage (Vss) may be facilitated by the plurality of second TSVs 314 instead of the plurality of first TSVs 312.

In an aspect of the present disclosure, the semiconductor device 324 may be electrically coupled to the package substrate 302 through the plurality of first TSVs 312, and the plurality of second TSVs 314. In an aspect, the semiconductor device 324 may be electrically coupled to the passive device 318 through the plurality of third TSVs 316. In an aspect, the third plurality of TSVs 316 may facilitate a short power loop inductance between the semiconductor device 324 and the passive device 318 without traversing through the package substrate 302. In an aspect, the semiconductor device 324 may be electrically coupled to the plurality of passive device 318 through the plurality of fourth TSVs 334. In an aspect, the plurality of fourth TSVs 334 may facilitate a short power loop inductance between the semiconductor device 324 and the plurality of passive device 318 without traversing through the package substrate 302.

In an aspect of the present disclosure, the semiconductor device 324, which may include the first semiconductor device 324A, the second semiconductor device 324B, and the third semiconductor device 324C, may pass signals and/or power to each other through an RDL 320 within the interposer 306. In an aspect, the RDL 320 may include a plurality of conductive traces interleaving with a plurality of dielectric layers. In further aspects, the RDL 320 is coupled to the plurality of first TSVs 312, the plurality of second TSVs 314, the plurality of third TSVs 316, and the plurality of fourth TSVs 334 within the interposer 306. In an aspect, the semiconductor device 324 may pass signal I/O and/or power from the package substrate 302 between the first semiconductor device 324A, the second semiconductor device 324B, and the third semiconductor device 324C through the RDL 320.

FIGS. 4A through 4G show cross-sectional views directed to an exemplary process flow for a method of forming a semiconductor package according to an aspect of the present disclosure.

Figure 4A:
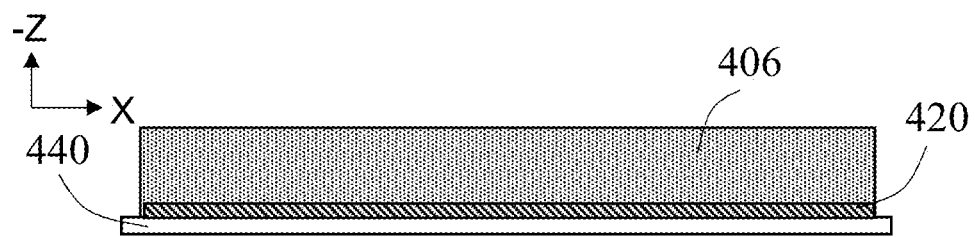
FIGS. 4A through 4G show cross-sectional views directed to an exemplary process flow for a method of forming a semiconductor package according to an aspect of the present disclosure.

As shown in FIG. 4A, an interposer 406 with an RDL 420 may be disposed on a carrier 440. The RDL 420 may be disposed on the interposer 406 through a photolithography, an electroplating and/or an etching process. The interposer 406 may be disposed on the carrier 440 through a lamination, a hot-press and/or a mechanical attachment process.

Figure 4B:
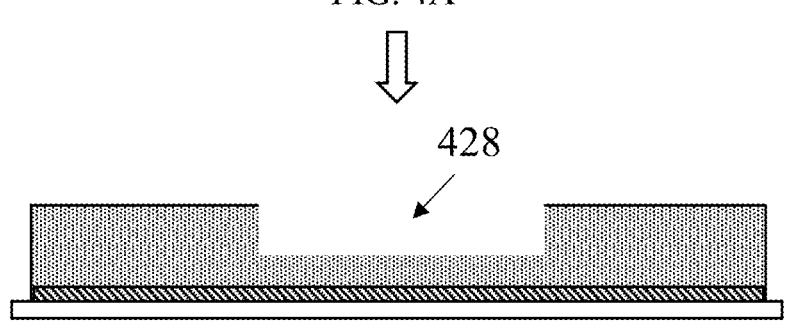

As shown in FIG. 4B, a recess 428 may be formed in the interposer 406 using mechanical drilling and/or laser drilling.

Figure 4C:
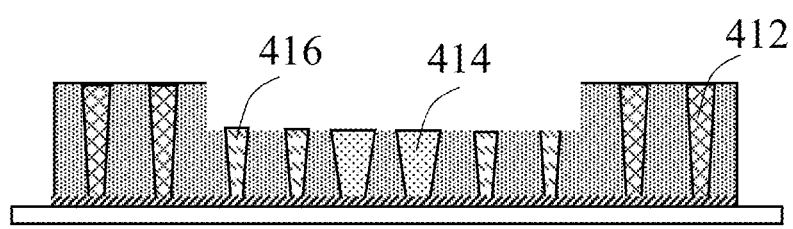

As shown in FIG. 4C, a plurality of via openings may be formed in the interposer 406 using mechanical drilling and/or laser drilling. A plurality of TSVs may be formed in the plurality of via openings using an electroplating process, a solder paste printing and/or a coating process. The plurality of TSVs may include a plurality of first TSVs 412, a plurality of second TSVs 414, and a plurality of third TSVs 416.

Figure 4D:
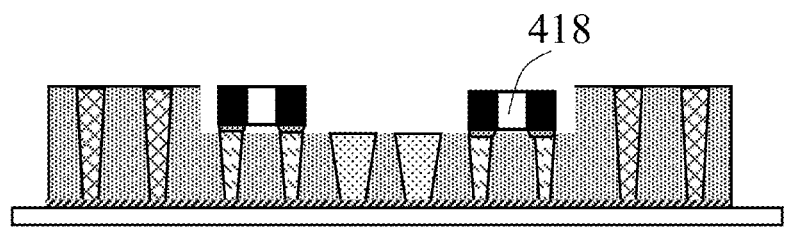

As shown in FIG. 4D, passive devices 418 may be attached to the interposer 406 using a thermal compression bonding process or a solder reflow process.

Figure 4E:
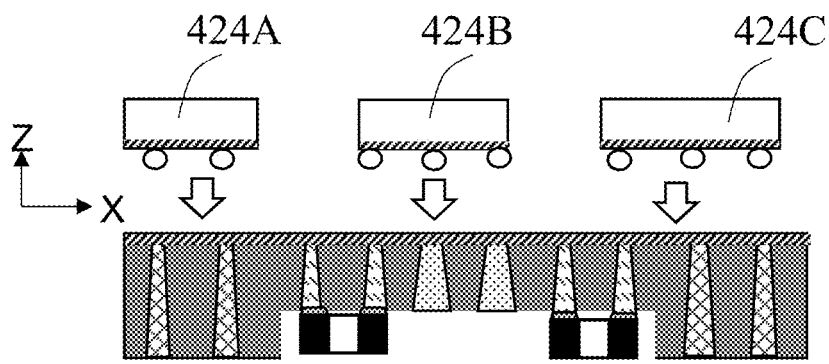

As shown in FIG. 4E, the structure of FIG. 4D may be flipped over. A first semiconductor device 424A, and a second semiconductor device 424B, a third semiconductor device 424C may be attached on the flipped structure using thermal compression bonding, and/or a solder reflow process.

Figure 4F:
Figure 4F:
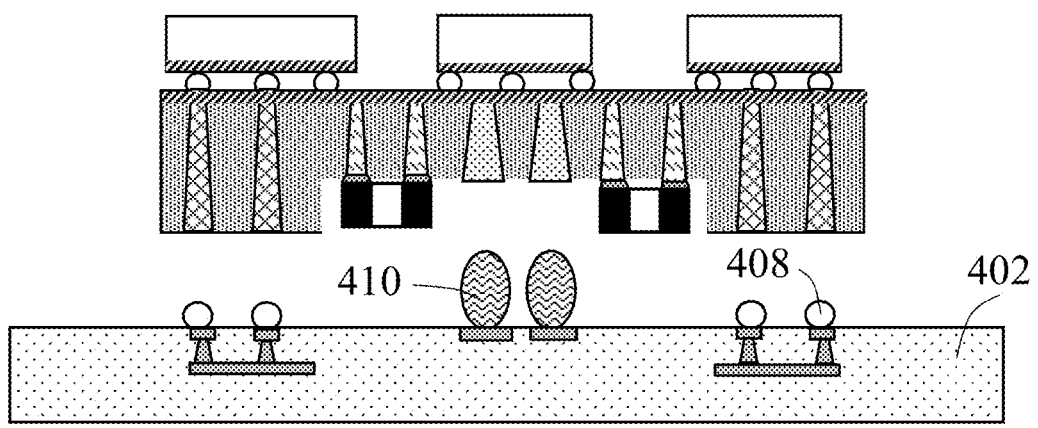

As shown in FIG. 4F, a package substrate 402 may be prepared according to conventional methods. A plurality of first package bumps 408 and a plurality of second package bumps 410 may be disposed on the package substrate 402 using a solder reflow process.

Figure 4G:
Figure 4G:
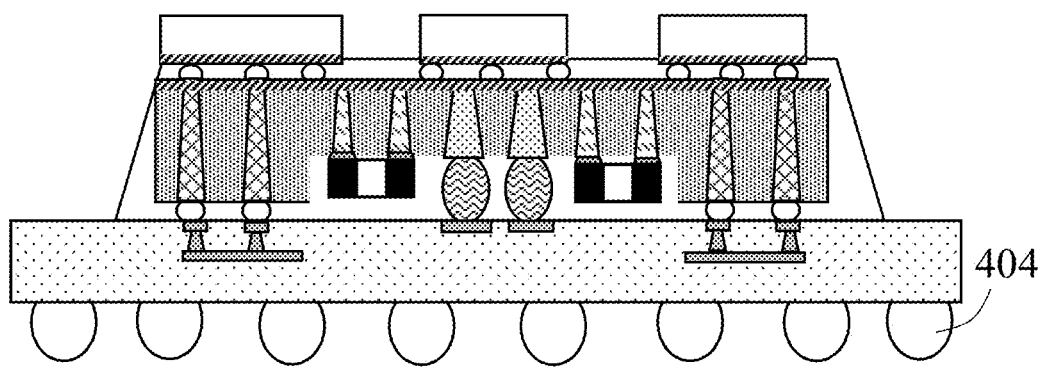

As shown in FIG. 4G, the interposer 406 may be disposed on the package substrate using a solder reflow process. The plurality of first TSVs 412 are disposed on the plurality of first package bumps 408, and the plurality of second TSVs 414 are disposed on the second package bumps 410. The package substrate 402 may have solder balls 404 on the opposing surface for connection to a motherboard. In addition, an underfill may be provided using either a conventional underfilling process and/or no-flow underfilling process to reduce the effects of thermal expansion.

It will be understood that the exemplary process described above relating to FIGS. 4A through 4G are not limited to this particular order. Any suitable, modified order of operations may be used.

Aspects of the present disclosure may be implemented into a system using any suitable hardware and/or software.

Figure 5:
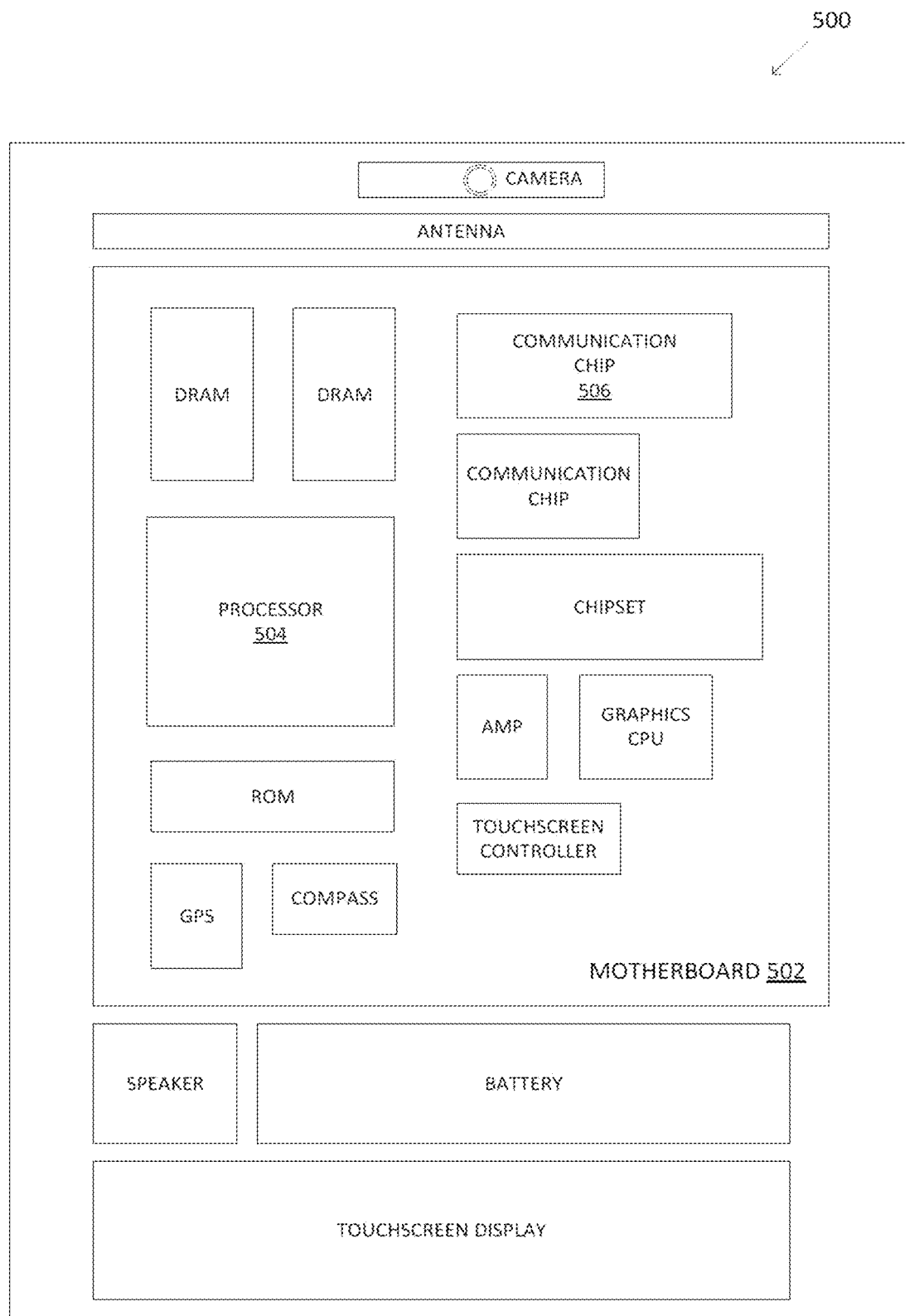
FIG. 5 shows an illustration of a computing device that includes a semiconductor package according to a further aspect of the present disclosure.

FIG. 5 schematically illustrates a computing device 500 that may include a semiconductor package as described herein, in accordance with some aspects.

As shown in FIG. 5, the computing device 500 may house a board such as a motherboard 502. The motherboard 502 may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the processor 504 of the computing device 500 may be packaged in a semiconductor package, as described herein, and/or other semiconductor devices may be packaged together in a semiconductor package as described herein.

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not. The communication chip 506 may implement any of a number of wireless standards or protocols, including but not limited to Institute for Electrical and Electronics Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 506 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other aspects.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an aspect, the computing device 500 may be a mobile computing device. In further implementations, the computing device 500 may be any other electronic device that processes data.

EXAMPLES

Example 1 may include a device including an interposer; a plurality of first through-silicon-vias disposed in the interposer, wherein the plurality of first through-silicon-vias have a first diameter; a plurality of second through-silicon-vias disposed in the interposer, wherein the plurality of second through-silicon-vias have a second diameter larger than the first via diameter; and a first recess in the interposer positioned at bottom ends of the plurality of second through-silicon-vias.

Example 2 may include the device of example 1 and/or any other example disclosed herein in which the device further includes a plurality of first solder bumps with a first bump diameter disposed below the plurality of first through-silicon-vias; a plurality of second solder bumps with a second bump diameter disposed in the first recess below the plurality of second through-silicon-vias, wherein the second bump diameter is larger than the first bump diameter; wherein the plurality of first solder bumps and the plurality of second solder bumps are configured to couple the interposer to a package substrate.

Example 3 may include the device of example 2 and/or any other example disclosed herein in which the device further includes at least one semiconductor device disposed on the interposer; wherein the plurality of first through-silicon-vias are configured to transmit signals from the interposer to the at least one semiconductor device; and wherein the plurality of second through-silicon-vias are configured to transmit power from the interposer to the at least one semiconductor device.

Example 4 may include the device of example 2 and/or any other example disclosed herein in which the device further includes a plurality of third through-silicon-vias with a second via length disposed in the interposer, wherein the second via length is shorter than a first via length of the plurality of first through-silicon-vias; and a first passive device coupled to the plurality of third through-silicon-vias.

Example 5 may include the device of example 4 and/or any other example disclosed herein in which the first passive device is disposed in the first recess.

Example 6 may include the device of example 4 and/or any other example disclosed herein in which the device further includes a second recess in the interposer positioned at bottom ends of the plurality of third through-silicon-vias, wherein the first passive device is disposed in the second recess.

Example 7 may include the device of example 4 and/or any other example disclosed herein in which the device further includes a plurality of fourth through-silicon-vias with a third via length disposed in the interposer, wherein the third via length is shorter than the second via length; and a plurality of second passive devices coupled to the plurality of fourth through-silicon-vias.

Example 8 may include the device of example 7 and/or any other example disclosed herein in which the device further includes a third recess in the interposer positioned at bottom ends of the plurality of fourth through-silicon-vias, wherein the plurality of second passive devices are disposed in the third recess.

Example 9 may include a method including forming an interposer; forming a first recess in the interposer; forming a plurality of first through-silicon-vias in the interposer, wherein the plurality of first through-silicon-vias have a first diameter; and forming a plurality of second through-silicon-vias in the interposer, wherein the plurality of second through-silicon-vias have a second diameter larger than the first via diameter, and wherein the first recess is positioned at bottom ends of the plurality of second through-silicon-vias.

Example 10 may include the method of example 9 and/or any other example disclosed herein in which the method further includes forming a plurality of first solder bumps with a first bump diameter below the plurality of first through-silicon-vias; forming a plurality of second solder bumps with a second bump diameter in the first recess below the plurality of second through-silicon-vias, wherein the second bump diameter is larger than the first bump diameter; coupling the interposer to a package substrate through the plurality of first solder bumps and the plurality of second solder bumps.

Example 11 may include the method of example 10 and/or any other example disclosed herein in which the method further includes forming at least one semiconductor device on the interposer; transmitting signals from the interposer to the at least one semiconductor device using the plurality of first through-silicon-vias; and transmitting power from the interposer to the at least one semiconductor device using the plurality of second through-silicon-vias.

Example 12 may include the method of example 10 and/or any other example disclosed herein in which the method further includes forming a plurality of third through-silicon-vias with a second via length in the interposer, wherein the second via length is shorter than a first via length of the plurality of first through-silicon-vias; and coupling a first passive device to the plurality of third through-silicon-vias.

Example 13 may include the method of example 12 and/or any other example disclosed herein in which the first passive device is disposed in the first recess.

Example 14 may include the method of example 12 and/or any other example disclosed herein in which the method further includes forming a second recess in the interposer and positioning the second recess at bottom ends of the plurality of third through-silicon-vias, wherein the first passive device is disposed in a second recess.

Example 15 may include the method of example 12 and/or any other example disclosed herein in which the method further includes forming a plurality of fourth through-silicon-vias with a third via length, wherein the third via length is shorter than the second via length; and coupling a plurality of second passive devices to the plurality of fourth through-silicon-vias.

Example 16 may include the method of example 15 and/or any other example disclosed herein in which the method further includes forming a third recess in the interposer and positioning the third recess at bottom ends of the plurality of fourth through-silicon-vias, wherein the plurality of second passive devices are disposed in the third recess.

Example 17 may include a computing device including a printed circuit board; and a device coupled to the printed circuit board comprising: an interposer; a plurality of first through-silicon-vias disposed in the interposer, wherein the plurality of first through-silicon-vias have a first diameter; a plurality of second through-silicon-vias disposed in the interposer, wherein the plurality of second through-silicon-vias have a second diameter larger than the first via diameter; and a first recess in the interposer positioned at bottom ends of the plurality of second through-silicon-vias.

Example 18 may include the computing device of example 17 and/or any other example disclosed herein in which the computing device further includes a plurality of first solder bumps with a first bump diameter disposed below the plurality of first through-silicon-vias; a plurality of second solder bumps with a second bump diameter disposed in the first recess below the plurality of second through-silicon-vias, wherein the second bump diameter is larger than the first bump diameter; wherein the plurality of first solder bumps and the plurality of second solder bumps are configured to couple the interposer to a package substrate.

Example 19 may include the computing device of example 18 and/or any other example disclosed herein in which the computing device further includes at least one semiconductor device disposed on the interposer; wherein the plurality of first through-silicon-vias are configured to transmit signals from the interposer to the at least one semiconductor device; and wherein the plurality of second through-silicon-vias are configured to transmit power from the interposer to the at least one semiconductor device.

Example 20 may include the computing device of example 18 and/or any other example disclosed herein in which the computing device further includes a plurality of third through-silicon-vias with a second via length disposed in the interposer, wherein the second via length is shorter than a first via length of the plurality of first through-silicon-vias; and a first passive device coupled to the plurality of third through-silicon-vias.

These and other advantages and features of the aspects herein disclosed will be apparent through reference to the following description and the accompanying drawings. Furthermore, it is to be understood that the features of the various aspects described herein are not mutually exclusive and can exist in various combinations and permutations.

It will be understood that any property described herein for a specific package or device may also hold for any package or device described herein. It will also be understood that any property described herein for a specific method may hold for any of the methods described herein. Furthermore, it will be understood that for any device, package, or method described herein, not necessarily all the components or operations described will be enclosed in the device, package, or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A device comprising:
   an interposer;
   a plurality of first through-silicon-vias disposed in the interposer, wherein the plurality of first through-silicon-vias have a first diameter;
   a plurality of second through-silicon-vias disposed in the interposer, wherein the plurality of second through-silicon-vias have a second diameter larger than the first via diameter; and
   a first recess in the interposer positioned at bottom ends of the plurality of second through-silicon-vias.

2. The device of claim 1, further comprising:
   a plurality of first solder bumps with a first bump diameter disposed below the plurality of first through-silicon-vias;
   a plurality of second solder bumps with a second bump diameter disposed in the first recess below the plurality of second through-silicon-vias, wherein the second bump diameter is larger than the first bump diameter;

wherein the plurality of first solder bumps and the plurality of second solder bumps are configured to couple the interposer to a package substrate.

3. The device of claim 2, further comprising:
at least one semiconductor device disposed on the interposer;
wherein the plurality of first through-silicon-vias are configured to transmit signals from the interposer to the at least one semiconductor device; and
wherein the plurality of second through-silicon-vias are configured to transmit power from the interposer to the at least one semiconductor device.

4. The device of claim 2, further comprising:
a plurality of third through-silicon-vias with a second via length disposed in the interposer, wherein the second via length is shorter than a first via length of the plurality of first through-silicon-vias; and
a first passive device coupled to the plurality of third through-silicon-vias.

5. The device of claim 4, wherein the first passive device is disposed in the first recess.

6. The device of claim 4, further comprising:
a second recess in the interposer positioned at bottom ends of the plurality of third through-silicon-vias, wherein the first passive device is disposed in the second recess.

7. The device of claim 4, further comprising:
a plurality of fourth through-silicon-vias with a third via length disposed in the interposer, wherein the third via length is shorter than the second via length; and
a plurality of second passive devices coupled to the plurality of fourth through-silicon-vias.

8. The device of claim 7, further comprising:
a third recess in the interposer positioned at bottom ends of the plurality of fourth through-silicon-vias, wherein the plurality of second passive devices are disposed in the third recess.

9. A method comprising:
forming an interposer;
forming a first recess in the interposer;
forming a plurality of first through-silicon-vias in the interposer, wherein the plurality of first through-silicon-vias have a first diameter; and
forming a plurality of second through-silicon-vias in the interposer, wherein the plurality of second through-silicon-vias have a second diameter larger than the first via diameter, and wherein the first recess is positioned at bottom ends of the plurality of second through-silicon-vias.

10. The method of claim 9, further comprising:
forming a plurality of first solder bumps with a first bump diameter below the plurality of first through-silicon-vias;
forming a plurality of second solder bumps with a second bump diameter in the first recess below the plurality of second through-silicon-vias, wherein the second bump diameter is larger than the first bump diameter;
coupling the interposer to a package substrate through the plurality of first solder bumps and the plurality of second solder bumps.

11. The method of claim 10, further comprising:
forming at least one semiconductor device on the interposer;
transmitting signals from the interposer to the at least one semiconductor device using the plurality of first through-silicon-vias; and transmitting power from the interposer to the at least one semiconductor device using the plurality of second through-silicon-vias.

12. The method of claim 10, further comprising:
forming a plurality of third through-silicon-vias with a second via length in the interposer, wherein the second via length is shorter than a first via length of the plurality of first through-silicon-vias; and
coupling a first passive device to the plurality of third through-silicon-vias.

13. The method of claim 12, wherein the first passive device is disposed in the first recess.

14. The method of claim 12, further comprising:
forming a second recess in the interposer and positioning the second recess at bottom ends of the plurality of third through-silicon-vias, wherein the first passive device is disposed in a second recess.

15. The method of claim 12, further comprising:
forming a plurality of fourth through-silicon-vias with a third via length, wherein the third via length is shorter than the second via length; and
coupling a plurality of second passive devices to the plurality of fourth through-silicon-vias.

16. The method of claim 15, further comprising:
forming a third recess in the interposer and positioning the third recess at bottom ends of the plurality of fourth through-silicon-vias, wherein the plurality of second passive devices are disposed in the third recess.

17. A computing device comprising:
a printed circuit board; and
a device coupled to the printed circuit board comprising:
an interposer;
a plurality of first through-silicon-vias disposed in the interposer, wherein the plurality of first through-silicon-vias have a first diameter;
a plurality of second through-silicon-vias disposed in the interposer, wherein the plurality of second through-silicon-vias have a second diameter larger than the first via diameter; and
a first recess in the interposer positioned at bottom ends of the plurality of second through-silicon-vias.

18. The computing device of claim 17, further comprising:
a plurality of first solder bumps with a first bump diameter disposed below the plurality of first through-silicon-vias;
a plurality of second solder bumps with a second bump diameter disposed in the first recess below the plurality of second through-silicon-vias, wherein the second bump diameter is larger than the first bump diameter;
wherein the plurality of first solder bumps and the plurality of second solder bumps are configured to couple the interposer to a package substrate.

19. The computing device of claim 18, further comprising:
at least one semiconductor device disposed on the interposer;
wherein the plurality of first through-silicon-vias are configured to transmit signals from the interposer to the at least one semiconductor device; and
wherein the plurality of second through-silicon-vias are configured to transmit power from the interposer to the at least one semiconductor device.

20. The computing device of claim 18, further comprising:
a plurality of third through-silicon-vias with a second via length disposed in the interposer, wherein the second via length is shorter than a first via length of the plurality of first through-silicon-vias; and a first passive device coupled to the plurality of third through-silicon-vias.

* * * * *